US009237663B2

(12) United States Patent
Bugaris et al.

(10) Patent No.: US 9,237,663 B2
(45) Date of Patent: Jan. 12, 2016

(54) METHODS AND APPARATUS FOR MITIGATING ARC FLASH INCIDENT ENERGY IN MOTOR CONTROL DEVICES

(71) Applicants: Rachel M. Bugaris, Homer Glen, IL (US); Daniel Robert Doan, Chadds Ford, PA (US)

(72) Inventors: Rachel M. Bugaris, Homer Glen, IL (US); Daniel Robert Doan, Chadds Ford, PA (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 295 days.

(21) Appl. No.: 13/856,571

(22) Filed: Apr. 4, 2013

(65) Prior Publication Data
US 2013/0265737 A1 Oct. 10, 2013

Related U.S. Application Data

(60) Provisional application No. 61/621,127, filed on Apr. 6, 2012.

(51) Int. Cl.
| | |
|---|---|
| *H05K 5/00* | (2006.01) |
| *H05K 5/02* | (2006.01) |
| *H05K 13/04* | (2006.01) |
| *H05K 7/14* | (2006.01) |

(52) U.S. Cl.
CPC ............... *H05K 5/02* (2013.01); *H05K 7/1432* (2013.01); *H05K 13/04* (2013.01); *Y10T 29/49117* (2015.01)

(58) Field of Classification Search
CPC combination set(s) only.
See application file for complete search history.

(56) References Cited

U.S. PATENT DOCUMENTS

| | | | | |
|---|---|---|---|---|
| 5,515,235 | A * | 5/1996 | Stoller | 361/605 |
| 5,879,523 | A * | 3/1999 | Wang et al. | 204/298.11 |
| 6,974,922 | B2 * | 12/2005 | Bortolloni et al. | 200/50.06 |
| 7,352,551 | B2 * | 4/2008 | Chevallier et al. | 361/118 |
| 7,510,223 | B2 | 3/2009 | Malkowski, Jr. et al. | |
| 7,576,985 | B2 * | 8/2009 | Kingston | 361/690 |
| 8,908,335 | B2 * | 12/2014 | Malkowski et al. | 361/2 |
| 2007/0085347 | A1 * | 4/2007 | Malkowski et al. | 292/59 |
| 2007/0097604 | A1 * | 5/2007 | Bruski et al. | 361/605 |

(Continued)

FOREIGN PATENT DOCUMENTS

WO WO8201887 6/1982

OTHER PUBLICATIONS

Process Materials, "Fluorides", 2005, Retrieved from the Internet on Jul. 8, 2013, URL:http:///www.processmaterials.com/fluorides.html, 2 pgs.

(Continued)

*Primary Examiner* — Lisa Lea Edmonds
(74) *Attorney, Agent, or Firm* — Fay Sharpe LLP

(57) ABSTRACT

Industrial motor control apparatus and techniques are presented for mitigating incident energy associated with an internal arcing. Interior enclosure surfaces and/or surfaces of electrical components are provided with textures and/or coatings which may be non-reflective with respect to visible and/or infrared light in order to redirect or absorb incident energy associated with internal arcing conditions. The electrical components are also arranged so as to substantially minimize the percentage of back wall exposure, and filler material and/or tile structures may be mounted within the enclosure, which may be non-reflective and/or have textured surfaces or coating layers to mitigate incident arcing energy. In addition, baffles or barriers may be provided within the enclosure to redirect or absorb incident energy from internal arcing.

10 Claims, 4 Drawing Sheets

(56) References Cited

U.S. PATENT DOCUMENTS

| | | | |
|---|---|---|---|
| 2008/0093932 A1* | 4/2008 | Whitt et al. | 307/112 |
| 2009/0021925 A1* | 1/2009 | Heimann et al. | 361/818 |
| 2009/0267466 A1* | 10/2009 | Zook et al. | 312/223.6 |
| 2009/0287446 A1 | 11/2009 | Wang et al. | |
| 2012/0097413 A1* | 4/2012 | Bugaris et al. | 174/50 |

OTHER PUBLICATIONS

International Search Report and Written Opinion, Int'l App. No. PCT/US2013/035532, Mailed Jul. 26, 2013, Authorized Officer Blain R. Copenheaver, ISA/US.

Stokes, Anthony D. et al., "Electric Arcing Burn Hazards", IEEE Transactions on Industry Applications, vol. 42, No. 1, Jan./Feb. 2006, 134-141.

Brown, William A. et al., "Incident Energy Reduction Techniques", IEEE Industry Applications Magazine, May/Jun. 2009, pp. 53-61.

Sutherland, Peter E., "Arc Flash and Coordination Study Conflict in an Older Industrial Plant", IEEE Transactions on Industry Applications, vol. 45 No. 2, Mar./Apr. 2009, pp. 569-574.

Das, J.C., "Protection Planning and System Design to Reduce Arc Flash Incident Energy in a Multi-Voltage-Level Distribution System to 8 cal/cm$^2$ (HRC 2) or Less—Part I: Methodology", IEEE Transactions on Industry Applications, vol. 47, No. 1, Jan./Feb. 2011, pp. 398-407.

Das, J.C., "Protection Planning and System Design to Reduce Arc Flash Incident Energy in a Multi-Voltage-Level Distribution System to 8 cal/cm$^2$ (HRC 2) or Less—Part II: Analysis", IEEE Transactions on Industry Applications, vol. 47, No. 1, Jan./Feb. 2011, pp. 408-420.

Lang, Michael J., "Impact of Arc Flash Events With Outward Convective Flows on Worker Protection Strategies", IEEE Transactions on Industry Applications, vol. 47, No. 4, Jul./Aug. 2011, pp. 1597-1604.

Bugaris, Rachel M. et al., "Arc-Resistent Equipment for Low-Voltage Motor Control Center Applications", IEEE Industry Applications Magazine, Jul./Aug. 2011, pp. 62-70.

Heberlein, Jr., G. Erich et al., "Report on Enclosure Internal Arcing Tests", IEEE Paper No. PCIC-94-32, 1994, pp. 271-184.

"DuPont Ti-Pure Titanium Dioxide, Titanium Dioxide for Coatings", DuPont Coatings Brochure, Jun. 1-28, 2007.

Cohen, Merrill et al., "Final Report, Infrared Reflectance Spectra for Selected Paint Pigments", U.S. Army, Aberdeen Research & Development Ctr., Coating & Chemical Laboratory, Aberdeen Proving Ground, Maryland, Jul. 1971 (Part 1 (pp. 1-49) and Part 2 (pp. 50-107) uploaded to separately via EFS Web).

"IEC Technical Report, Rapport Technique", IEC/TR 61641, Edition 2.0, 2008, pp. 1-25.

"1584 IEEE Guide for Performing Arc-Flash Hazard Calculations", IEEE Industry Applications Society, Sep. 23, 2002 (Part 1 pp. (1-54) and Part 2 (pp. 55-113) uploaded separately via EFS Web).

"IEEE Guide for Testing Metal-Enclosed Switchgear Rated Up to 38 kV for Internal Arcing Faults", IEEE Power Engineering Society, Jan. 18, 2008, pp. 1-37.

\* cited by examiner

METHODS AND APPARATUS FOR MITIGATING ARC FLASH INCIDENT ENERGY IN MOTOR CONTROL DEVICES

REFERENCE TO RELATED APPLICATION

This application claims priority to and the benefit of U.S. Provisional Patent Application Ser. No. 61/621,127, filed Apr. 6, 2012, entitled METHODS AND APPARATUS FOR MITIGATING ARC FLASH INCIDENT ENERGY IN MOTOR CONTROL DEVICES, the entirety of which is hereby incorporated by reference.

BACKGROUND

Motor control centers (MCCs) provide fully or partially enclosed equipment for operating electric motors and associated control operations. Industrial control equipment likewise includes electrical components housed within an enclosure. Accordingly, these devices and systems have internal components which are connected to electrical power. When power lines are shorted or other electrical fault conditions occur, electrical arcing may result, and there is a continuing need for improved MCCs and techniques for mitigating adverse effects of arcing conditions.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

The present disclosure provides industrial control or motor control apparatus and techniques by which the adverse effects of internal arcing conditions may be mitigated. The apparatus includes an enclosure with an interior in which one or more electrical components are mounted. This regard, the concepts and techniques disclosed herein find utility in association with any suitable component location compartment, or internal space within an enclosure, such as in a bus compartment where power bus bars are located, wire ways within an enclosure, etc., wherein bus bars and wiring are components as used herein. In accordance with certain aspects of the disclosure, all or a portion of one or more interior surfaces of one or more enclosure walls are textured or provided with a coating layer to redirect or absorb incident energy associated with internal arcing conditions. The textured surface or the coating layer is non-reflective with respect to visible and/or infrared light in certain embodiments. In certain embodiments, moreover, one or more electrical components within the enclosure is provided with a textured surface and/or a coating layer, which may be non-reflective. One or more tile structures may be mounted within the enclosure, having a textured surface and/or coating layer for incident arcing energy redirection and/or absorption, and the tiles may have non-reflective surfaces in certain embodiments. Filler material may be mounted within the enclosure interior to redirect or absorb incident arcing energy, and such filler material may be non-reflective with respect to visible and infrared light. One or more baffles or barriers may be mounted inside the enclosure to redirect or absorb incident arcing energy, where the baffle or barrier may have a textured surface or coating layer for incident arcing energy redirection or absorption, and the barrier may be non-reflective.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
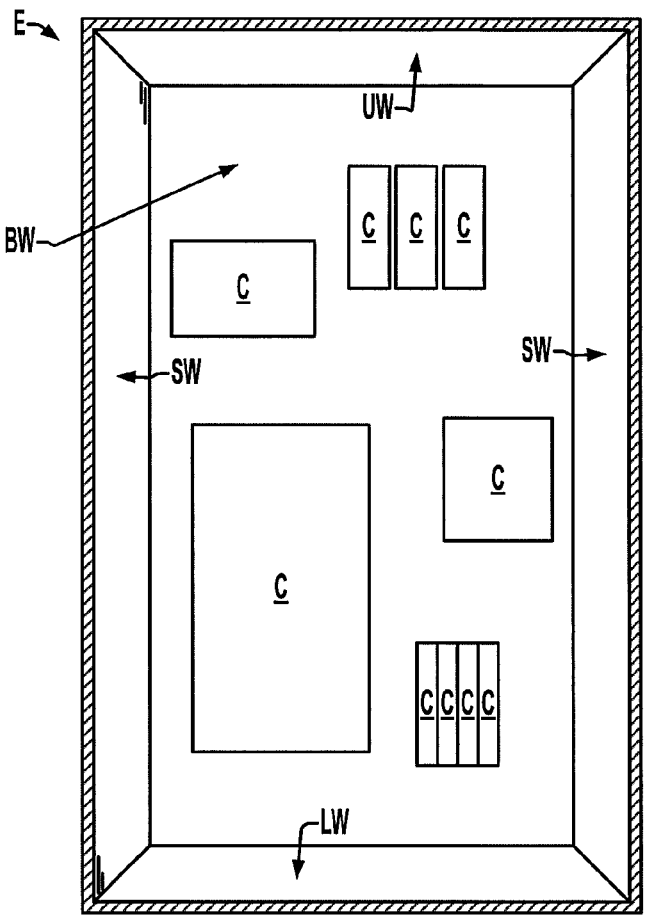
FIG. 1 is a front elevation view illustrating the interior of an exemplary MCC unit with a plurality of components in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale.

The following references are incorporated herein by reference as if fully set forth herein: [1] Heberlein, G. E., Jr.; Higgins, J. A.; Epperly, R. A.; "Report on enclosure internal arcing tests"; IEEE Industry Applications Magazine; Volume: 2, Issue: 3; Publication Year: 1996; Page(s): 35-42; [2] IEEE Xplore® website: http://ieeexplore.ieee.org/Xplore/dynhome.jsp; [3] Das, J. C.; "Protection Planning and System Design to Reduce Arc Flash Incident Energy in a Multi-Voltage-Level Distribution System to 8 cal/cm$^2$ (HRC 2) or Less—Part I: Methodology"; IEEE Transactions on Industry Applications; Volume: 47, Issue: 1; Publication Year: 2011; Page(s): 398-407; [4] Das, J. C.; "Protection Planning and System Design to Reduce Arc-Flash Incident Energy in a Multi-Voltage-Level Distribution System to 8 cal/cm² (HRC 2) or Less—Part II: Analysis"; IEEE Transactions on Industry Applications; Volume: 47, Issue: 1; Publication Year: 2011; Page(s): 408-420; [5] Brown, W. A. and Shapiro, R.; "Incident energy reduction techniques: A comparison using low-voltage power circuit breakers"; IEEE Industry Applications Magazine: Volume: 15, Issue: 3; Publication Year: 2009; Page (s): 53-61; [6] Sutherland, P. E.; "Arc Flash and Coordination Study Conflict in an Older Industrial Plant"; IEEE Transactions on Industry Applications; Volume: 45, Issue: 2; Publication Year: 2009; Page(s): 569-574; [7] Bugaris, R. M. and Rollay, D. T.; "Arc-Resistant Equipment"; IEEE Industry Applications Magazine; Volume: 17, Issue: 4; Publication Year: 2011, Page(s): 62-70; [8] IEC/TR 61641:2008, Enclosed low-voltage switchgear and controlgear assemblies—Guide for testing under conditions or arcing due to internal fault, Geneva, Switzerland: IEC; [9] IEEE C37.20.7-2007, IEEE Guide for Testing Metal—Enclosed Switchgear Rated Up to 38 kV for Internal Arcing Faults, New York, N.Y.: IEEE; [10] IEEE P1683, Guide for Specifying Motor Control Centers Rated Up To 600 V AC or 1000 V DC With Features Intended to Reduce Electrical Hazards While Performing Defined Operations, New York, N.Y.: IEEE; [11] IEEE 1584-2002 "Guide for Performing Arc-Flash Hazard Calculations"; [12] Cohen, M. and Doner, J. P.; "Final Report—Infrared Reflectance Spectra for Selected Paint Pigments"; CCL Report No. 293, US Army Aberdeen Research and Development Center, Coating and Chemical Laboratory, National Technical Information Service, July 1971; [13] Stokes, A. D.; Sweeting, D. K.; "Electric arcing burn hazards", IEEE Transactions on Industry Applications, Volume: 42, Issue: 1, Page(s): 134-141; and [14] Lang, M. J.; Jones, K. S.; Neal, T. E.; "Impact of Arc Flash Events With Outward Convective Flows on Worker Protection Strategies", IEEE Transactions on Industry Applications, Volume: 47, Issue: 4 Page(s): 1597-1604.

The inventors have evaluated how different low voltage motor control center (MCC) unit configurations are related to incident energy exposure when an arcing fault occurs and analyzed several variables including unit type, unit size, percent fill of unit, power wire size and length, location of the unit within the structure, and their relationships to incident energy as well as arcing duration and arcing current. Among the variables that were analyzed, the magnitude of incident energy measured during an arcing event was observed to be related to the percent fill of components within the units and properties of interior unit surfaces. Without wishing to be tied to any particular theory, it is believed that other factors may affect exposure to incident energy. For example, the contents of the MCC unit, or bucket, may affect the incident energy. A variety of design configuration variables have been evaluated including unit type, unit size, percent fill, power wire size and length, location of the unit within the structure, and certain of these variables are believed to significantly affect the arc flash energy results. Using those design factors, apparatus and techniques are disclosed below to help reduce the arc flash hazard exposure of MCC and industrial control equipment.

The addition of non-reflective filler materials or tiles or coatings or texturizing within units can facilitate reduction in the amount of incident energy within the arc flash boundary. The filler material functions like a sponge, absorbing the arc energy before it is directed outside of the unit. Additionally, the use of strategically placed baffles and barriers, or the more complex geometry of installed components, could help impede the path of the energy, redirecting and/or absorbing the energy so the resulting energy that reaches an opening would be reduced. The present disclosure accordingly facilitates this goal by unit and enclosure designs and section layouts reducing potential incident energy exposure. Moreover, the relationship between unit and section layout variables can also be applied when determining "worst-case" configurations with respect to internal arcing fault conditions.

The inventors have found that relationships between incident energy and internal unit designs exist, such as the density or percent fill of a unit and the amount of reflectivity on surfaces inside the unit. Increasing the percent fill of the unit leads to lower incident energy, and decreasing the percent reflectivity of surfaces leads to shorter arcing durations and lower incident energy.

Motor control centers (MCCs) can be configured in single column or multi-column arrangements, where the columns or multi-column configurations provide an overall enclosure E in which one or more units, themselves having an enclosure labeled E in the drawings, are mounted. The overall column enclosures E and the units themselves, each individually house one or more electrical components, labeled C in the various drawings. The concepts of the present disclosure may be advantageously employed in the illustrated MCC column and unit housings, both referred to herein as "enclosures", and may also be employed in connection with other types, shapes, sizes, and forms of motor control equipment and/or industrial control equipment, in which an enclosure E defines an interior in which one or more electrical components C are mounted directly or indirectly to one of a plurality of walls constituting the enclosure E. A column enclosure E may be outfitted with a variety of power distribution structures and components, such as connectors, bus bars, etc., as well as rigid mechanical mounting structures, or mechanisms for slidingly supporting motor drive units, starter units, and/or a variety of functional units, where the units themselves may include one or more electrical components C mounted within an interior of a unit enclosure E.

Moreover, the disclosed techniques find utility in association with any unit or compartment type within an enclosure typically found in an industrial control apparatus and/or in a motor control system, such as a soft starter unit in a MCC, a variable frequency motor drive unit within an MCC, and a circuit breaker, starter, and network linking units within an MCC, etc. Individual units may comprise an enclosure E with an upper wall UW, a lower wall LW, one or more sidewalls SW including the inner side of a cabinet front panel or door, and a back wall BW. As used herein, walls can include full or partial walls including the inner side of a cabinet front panel or door, partitions, which may but need not be solid or fully separated, for instance, including frameworks within an enclosure E. The walls and partitions of these enclosures E define an interior space in which at least one electrical component C is mounted directly or indirectly to at least one of the walls UW, LW, NSW, BW and/or the inner side of a cabinet front panel or door. In the case of motor control center units, many electrical components C are typically mounted to the back wall BW. Electrical components, as used herein, refers to structures which conduct electrical current, as well as housings therefore, such as any structure which is or includes a circuit board, circuit component, etc. Multi-column MCC apparatus can be provided in which a variety of different unit types are installed, where a horizontal and vertical busbar power distribution system is mounted, directly or indirectly, to the back wall of the column enclosures E, and the various MCC units are installed in compartments which can be sliding trays, or which can be a non-sliding (e.g., rigid) mounting locations for the corresponding unit enclosures E. In certain embodiments, moreover, horizontal bus bars can be located in a top compartment of the enclosure E, as opposed to along the back wall BW. One, some, or all of these compartments can have front panels or "doors" and/or a door can be provided covering all the compartments of a given column.

FIGS. 1-9 illustrates various concepts of the present disclosure with respect to mitigating adverse effects of arcing conditions within an enclosure E, wherein these examples are shown in the context of unit enclosures E (e.g., sometimes referred to as "buckets"), although the disclosed techniques can be implemented in any form of industrial control and/or motor control cabinet, such as overall column enclosures. As seen in FIG. 1, the motor control apparatus includes an enclosure E with walls UW, SW, LW and BW and a front wall such as a panel or door (not shown) forming a rectangular interior space in which electrical components C are mounted. In the example of FIG. 1, the components C are mounted to the back wall BW, although other embodiments are possible in which components C may be mounted, directly or indirectly, to any of the walls of the enclosure E.

Figure 2:
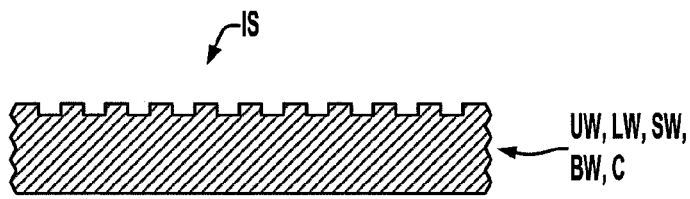
FIG. 2 is a partial sectional side elevation view illustrating an exemplary portion of an enclosure wall or system component with a textured interior surface in accordance with one or more aspects of the disclosure.
Figure 3:
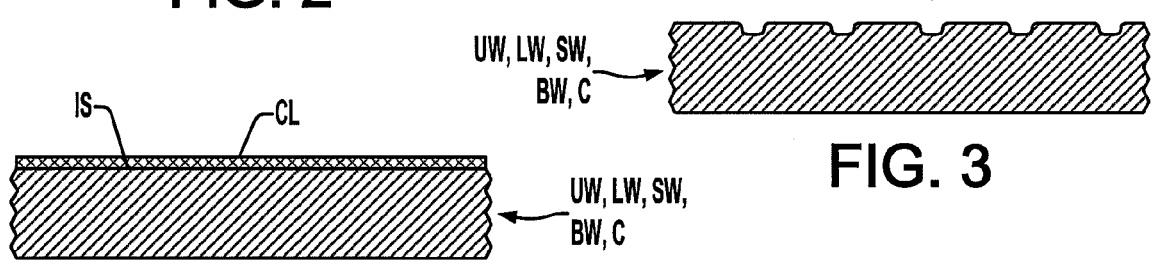
FIG. 3 is a partial sectional side elevation view illustrating an exemplary portion of another enclosure wall or system component with a different textured interior surface according to the disclosure.
Figure 4:
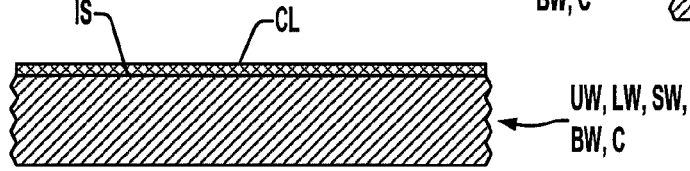
FIG. 4 is a partial sectional side elevation view illustrating another exemplary portion of an enclosure wall or system component having a coating layer to redirect or absorb incident energy associated with internal arcing conditions in the MCC unit.

Referring also to FIGS. 2-4, in accordance with certain aspects of the present disclosure, all or a portion of an interior surface IS of one or more of the walls UW, LW, SW, BW and/or the inner side of a cabinet front panel or door, and/or of one or more of the components C is provided with a textured surface and/or a coating layer CL so as to redirect and/or to absorb incident energy associated with an interior arcing condition inside the enclosure E. In particular, the surface texturing and/or coating, and/or the selective addition of tile structure T and/or materials M described below, are preferably designed to redirect and/or absorb incident energy values in the range of about 0.1 to about 10.0 cal/cm$^2$ or possibly up to about 50.0 cal/cm$^2$.

As seen in FIGS. 2 and 3, a textured structure can be any suitable form or shape which effectively increases the surface area of the interior wall surface IS or a portion thereof. For instance, the surface can be scored, scraped, etched, or otherwise formed into a rib/groove surface (e.g., FIG. 2), or recessed portions can be indented into the surface IS by any suitable mechanical and/or chemical means and techniques, or such can be created during formation of the wall, such as by suitable molding and/or extruding techniques. The same can be done for one or more surfaces of the electrical components C, such as through creating textured surfaces during molding processes providing structures of the components C. In this regard, such textured surfaces are provided on any surface of the components C and/or the enclosure walls UW, LW, SW and/or BW, which surface faces the interior of the enclosure E, and which surfaces are referred to herein as "interior surfaces", even though such may be on the exterior of a component C itself. The textured surface on the interior surface IS of one or more of the enclosure walls and/or of one or more of the components C in certain embodiments is non-reflective with respect to visible light and infrared light. For instance, in certain embodiments the textured interior surface IS has a reflectivity in the range of 0 to 50% for both visible and infrared spectrums.

FIG. 4 depicts another exemplary portion of the interior surface IS of an enclosure wall UW, LW, SW and/or BW and/or the inner side of a cabinet front panel or door, and/or of a system component C having a coating layer CL to redirect or absorb incident energy associated with internal arcing conditions in the MCC unit. The coating layer CL can be any suitable material which operates to absorb or redirect such incident arcing energy, and can be formed to any suitable thickness on the surface IS using any suitable application technique in order to facilitate this incident energy absorption and/or redirection. In certain embodiments, moreover, the coating layer CL is non-reflective with respect to visible and infrared light, for instance, having a reflectivity in the range of 0 to 50%. For instance, the coating layer CL can be a darker color, such as black, and the coating layer CL can be a flat color having a rough surface, as opposed to lighter gloss surfaces.

In certain embodiments, moreover, a texture or rough surface can be provided via the coating layer CL, such as by etching, scoring, stippling, or other suitable application techniques or post application processing that provides a rough textured outer surface to the coating layer CL. Also, separately or in combination, a coating layer CL can be applied to a textured surface of the interior surface IS of the enclosure wall and/or of one or more of the components C.

Figure 5:
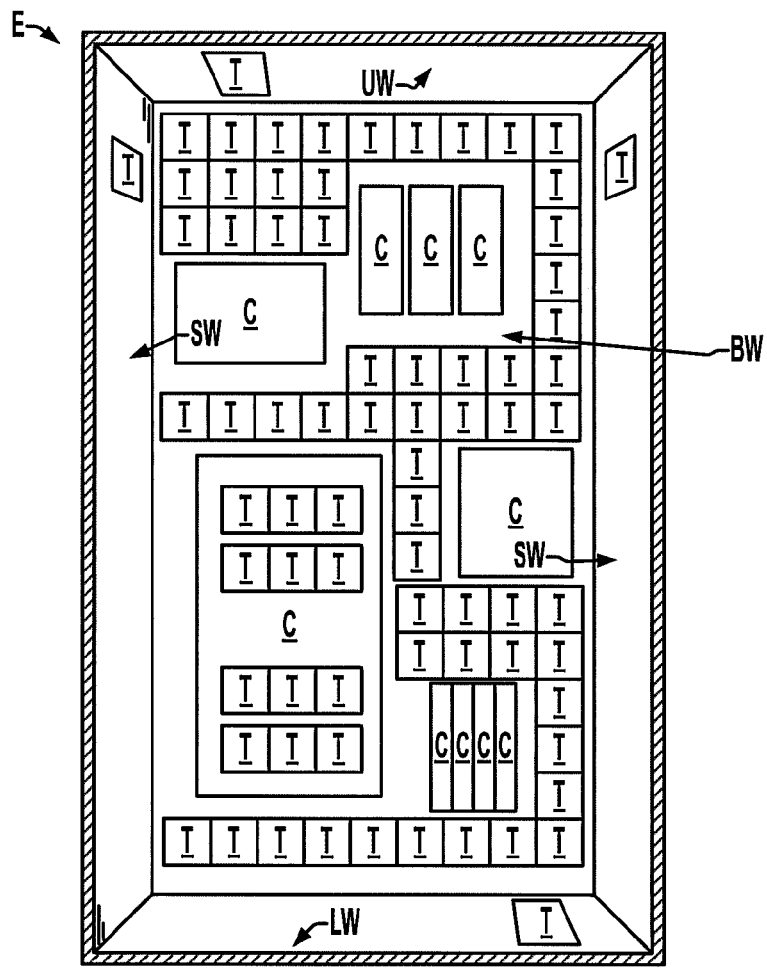
FIG. 5 is a front elevation view illustrating the interior of an exemplary MCC unit with a plurality of components and tile structures positioned on portions of the enclosure walls to redirect and/or absorb incident arcing energy in accordance with further aspects of the disclosure.
Figure 6:
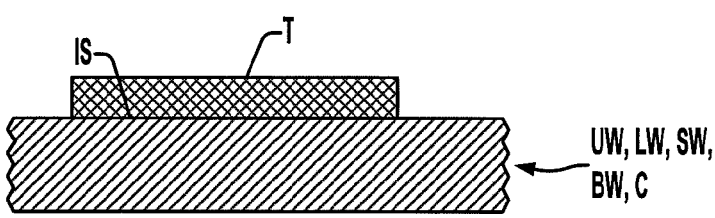
FIG. 6 is a partial sectional side elevation view illustrating an exemplary tile structure in the MCC unit of FIG. 5.
Figure 7:
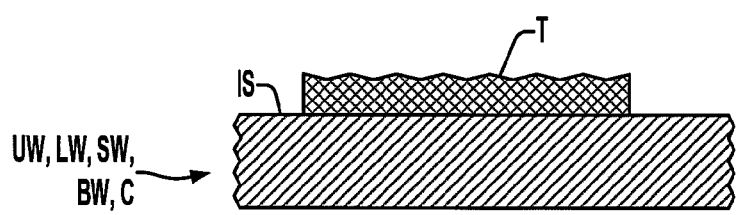
FIG. 7 is a partial sectional side elevation view illustrating another exemplary tile structure with a textured surface in the MCC of FIG. 5.

FIGS. 5 and 6 show another embodiment of an MCC unit with a plurality of components C and tile structures T positioned or otherwise mounted directly or indirectly to portions of the enclosure walls UW, LW, SW and/or BW and/or the inner side of a cabinet front panel or door to redirect and/or absorb incident arcing energy in accordance with the disclosure. In this regard, the tile structures T, textured surface concepts, coating layers CL, and/or filler material M described herein can be affixed to or otherwise extend into corners and edges where two of the walls UW, LW, SW, BW and/or the inner side of a cabinet front panel or door meet, and/or in corners/edges joining one or more of the walls with one or more of the components C. Also, one or more tile structures T can be mounted, directly or indirectly, to one or more of the components C. For instance, the tile structures T can be adhesive-backed rectangles or other shapes, allowing easy installation onto otherwise-open portions of one or more of the enclosure walls UW, LW, SW, BW and/or the inner side of a cabinet front panel or door and/or onto one or more of the components C. The tile structures T can be used separately or in combination with the above-mentioned interior surface texturizing and/or coating layer CL concepts. In certain embodiments, the tile structures T are non-reflective with respect to visible and infrared light, e.g., having a reflectivity of less than about 50%. For instance, the tile structures T can be a darker color, such as black, and the surfaces of the tile structures T can be a flat color having a rough (e.g., textured) surface. In addition, a coating layer CL can be provided on all or a portion of the exposed surfaces of the tile structures T in certain embodiments (not shown). Moreover, as illustrated in FIG. 7, one or more surfaces of the tile structure T can be textured by any suitable techniques, alone and/or in combination with a coating layer CL.

Figure 8:
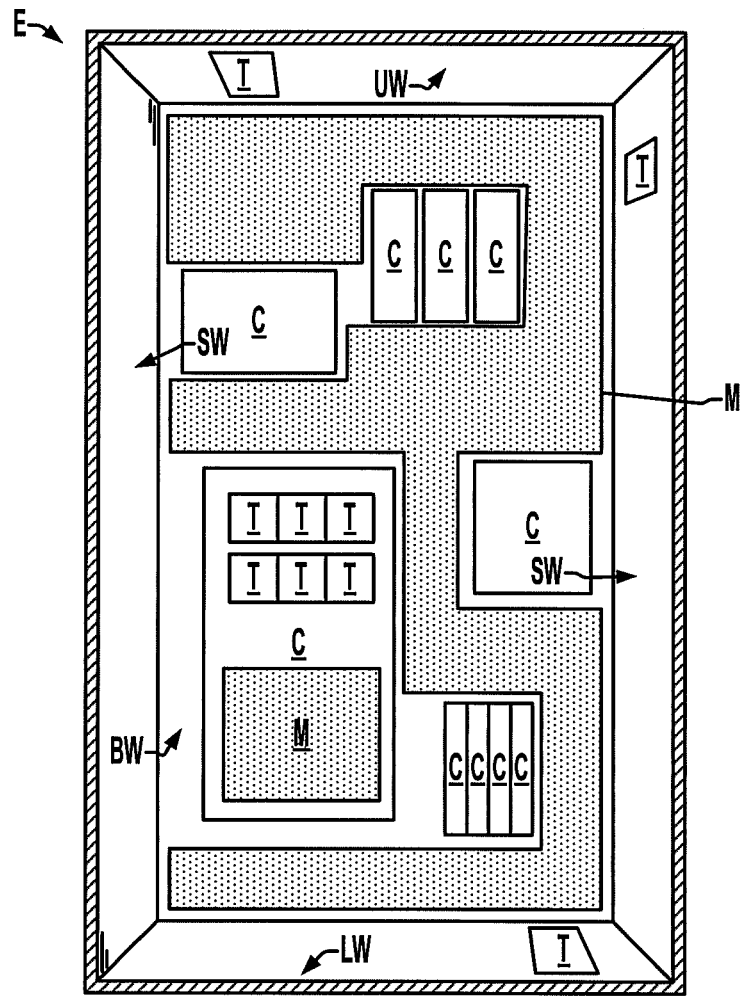
FIG. 8 is a front elevation view illustrating the interior of another exemplary MCC unit including a filler material mounted on portions of the back wall to redirect and/or absorb incident arc energy in accordance with the present disclosure.

FIG. 8 illustrates another exemplary MCC unit in which filler material M is provided on otherwise open portions of the back wall BW to redirect and/or absorb incident arc energy. Any suitable material M may be used which redirects and/or absorbs such incident energy associated with internal arcing conditions in the enclosure E, and the material M may be of any suitable thickness and shape. In certain embodiments, the material M can preferably be a dark color and can have a rough textured surface. Moreover, in certain embodiments, the filler material M is preferably non-reflective with respect to visible and infrared light, for example, having a reflectivity in the range of 0 to 50%. The filler material M may be installed using any suitable mounting techniques, and is preferably positioned in otherwise-open areas of one or more of the walls UW, LW, SW, BW and/or the inner side of a cabinet front panel or door and/or onto one or more of the components C and/or corners/edges associated therewith.

Figure 9:
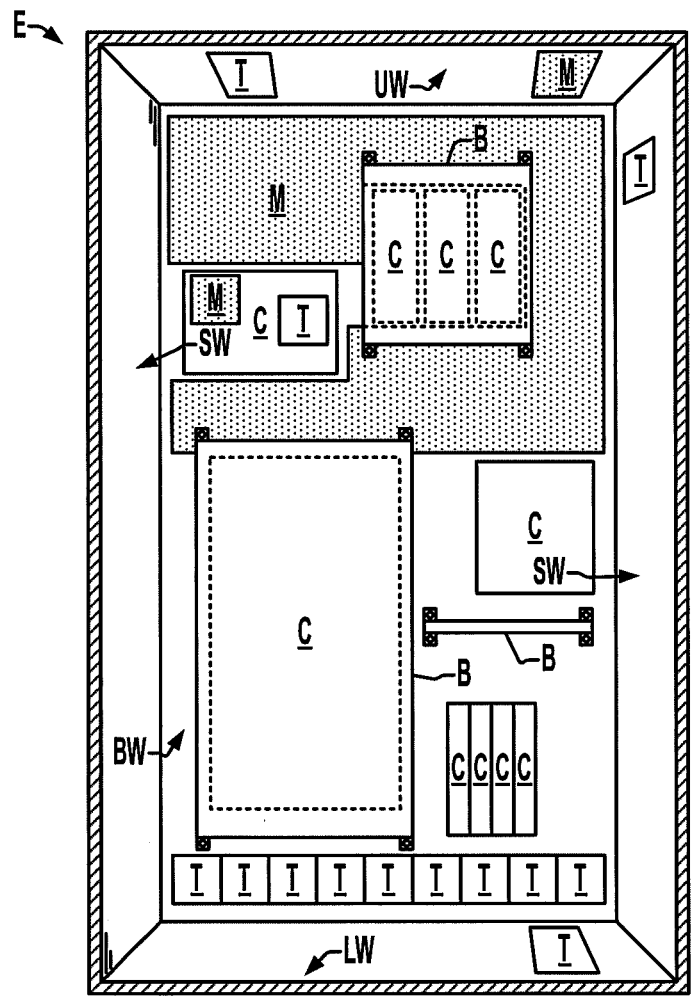
FIG. 9 is a front elevation view illustrating the interior of yet another exemplary MCC unit including one or more baffles or barriers to redirect or absorb incident energy associated with internal arcing conditions inside the enclosure.

Another embodiment is illustrated in FIG. 9 including one or more baffles or barriers B to redirect or absorb incident energy associated with an arcing condition inside the enclosure. These baffles/barrier structures B can be flat plates parallel with one of the upper, lower or side walls UW, LW, SW, or can be flat plates mounted so as to extend generally parallel with the back wall BW, thereby covering all or a portion of one or more of the components C as shown in the figure. In addition, other baffles/barrier structures B can be provided which are not strictly flat, and can be positioned to redirect or otherwise mitigate transference of incident arcing energy outward towards the front opening of the enclosure E. In certain embodiments, the baffles and/or barriers can include a textured surface and/or a coating layer CL as described above to facilitate redirection and/or absorption of incident arcing energy. In addition, one or more tile structures T and/or pieces of filler material M can be provided on one or more of the barriers or baffles B. Furthermore, the barriers and/or baffles B are preferably made of a dark color and can have a rough textured surface. Moreover, in certain embodiments, the barriers and/or baffles B are preferably non-reflective with respect to visible and infrared light, for example, having a reflectivity below about 50%. The barriers and/or baffles B can be installed using any suitable mounting techniques, such as suitable mounting bolts screws or other fastening techniques, and these can in certain cases be mounted to one or more of the walls of the enclosure E.

In various embodiments, moreover, the adverse effects of internal arcing conditions can be mitigated by selectively arranging the electrical components C within the enclosure interior, for example, to maximize the coverage (e.g., minimize the exposure) of highly reflective or smooth interior surfaces in the interior of the enclosure, such as minimizing exposure of the back wall BW, and/or to maximize percent fill, alone or in combination with one or more of the above described techniques.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. An industrial control or motor control apparatus, comprising:
    an enclosure comprising an upper wall, a lower wall, at least one sidewall, and a back wall, the walls defining an enclosure interior and at least one of the walls comprising an interior surface facing the enclosure interior; and
    at least one electrical component mounted directly or indirectly to at least one of the walls within the enclosure interior;
    wherein at least a portion of the interior surface of at least one of the walls comprises at least one of a textured surface and a coating layer to redirect incident energy associated with an internal arcing condition within the enclosure.

2. The apparatus of claim 1, wherein the textured surface or the coating layer is non-reflective with respect to visible and infrared light.

3. The apparatus of claim 1, wherein the at least one electrical component comprises at least one of a textured surface and a coating layer to redirect incident energy associated with an internal arcing condition within the enclosure.

4. The apparatus of claim 1, comprising at least one tile structure mounted directly or indirectly to the interior surface of at least one of the walls or to the at least one electrical component, the at least one tile structure comprising at least one of a textured surface and a coating layer to redirect incident energy associated with an internal arcing condition within the enclosure.

5. The apparatus of claim 4, wherein the at least one tile structure is non-reflective with respect to visible and infrared light.

6. The apparatus of claim 1, comprising a filler material mounted within the enclosure interior, the filler material operative to redirect incident energy associated with an internal arcing condition within the enclosure.

7. The apparatus of claim 6, wherein the filler material is non-reflective with respect to visible and infrared light.

8. The apparatus of claim 1, comprising at least one baffle or barrier mounted within the enclosure interior, the at least one baffle or barrier operative to redirect incident energy associated with an internal arcing condition within the enclosure.

9. The apparatus of claim 8, wherein the at least one baffle or barrier is non-reflective with respect to visible and infrared light.

10. The apparatus of claim 8, wherein the at least one baffle or barrier comprises at least one of a textured surface and a coating layer to redirect incident energy associated with an internal arcing condition within the enclosure.

* * * * *